United States Patent [19]
Deguchi

[11] Patent Number: 5,147,468
[45] Date of Patent: Sep. 15, 1992

[54] PHOTOVOLTAIC SEMICONDUCTOR DEVICE AND METHOD FOR MANUFACTURING THE SAME

[75] Inventor: Mikio Deguchi, Itami, Japan

[73] Assignee: Mitsubishi Denki Kabushiki Kaisha, Tokyo, Japan

[21] Appl. No.: 714,934

[22] Filed: Jun. 13, 1991

[30] Foreign Application Priority Data

Oct. 17, 1990 [JP] Japan ............................ 2-281060

[51] Int. Cl.⁵ ..................... H01L 31/05; H01L 31/18
[52] U.S. Cl. ..................... 136/244; 136/249; 437/2
[58] Field of Search ............ 136/244, 249 TJ; 437/2-5, 205

[56] References Cited

U.S. PATENT DOCUMENTS 5,035,753 7/1991 Suzuki et al. ............... 136/249 TJ

FOREIGN PATENT DOCUMENTS 59-167072  9/1984  Japan ............................ 136/244
59-182578  10/1984 Japan ............................ 136/244
61-50381   3/1986  Japan ............................ 136/244

OTHER PUBLICATIONS

Reis et al., "Recrystallized Silicon Film Structures For Solar Cells", *IEEE Photovoltaic Specialists Conference*, 1988, pp. 1405-1408.
Barnett, "Development Of Large Area Thin Crystalline Silicon-Film Solar Cells", *IEEE Photovoltaic Specialists Conference*, 1988, pp. 1569-1574.
Barnett et al., "Silicon-Film Solar Cell Development On Ceramic Substrates", *9th E.C. Photovoltaic Solar Energy Conference*, 1989, pp. 697-699.
Kruhler, "A Four-Terminal Thin-Film Tandem Solar Module Using a-Si:H And c-Si", *3rd Int'l Photovoltaic Science and Engineering Conference*, Tokyo, Japan, 1987, pp. 449-452.

*Primary Examiner*—Aaron Weisstuch
*Attorney, Agent, or Firm*—Leydig, Voit & Mayer

[57] ABSTRACT

A semiconductor device has a plurality of unit photovoltaic elements arranged on a substrate and connected to each other in series. The photovoltaic device includes first semiconductor layers with low resistivity formed on a high-temperature-resistant insulating substrate and spaced apart at a predetermined interval and second semiconductor layers selectively formed on corresponding first semiconductor layers so that a part of the respective first semiconductor layer is exposed. The second semiconductor layer is not in contact with the first semiconductor layer of an adjacent unit photovoltaic element. An electrode formed on the second semiconductor layer is in contact with the first semiconductor layer of the adjacent unit photovoltaic element. As a result, there is provided a photovoltaic semiconductor device comprising a plurality of unit photovoltaic elements connected to each other in series with high conversion efficiency and which is not easily degraded by light irradiation.

12 Claims, 14 Drawing Sheets

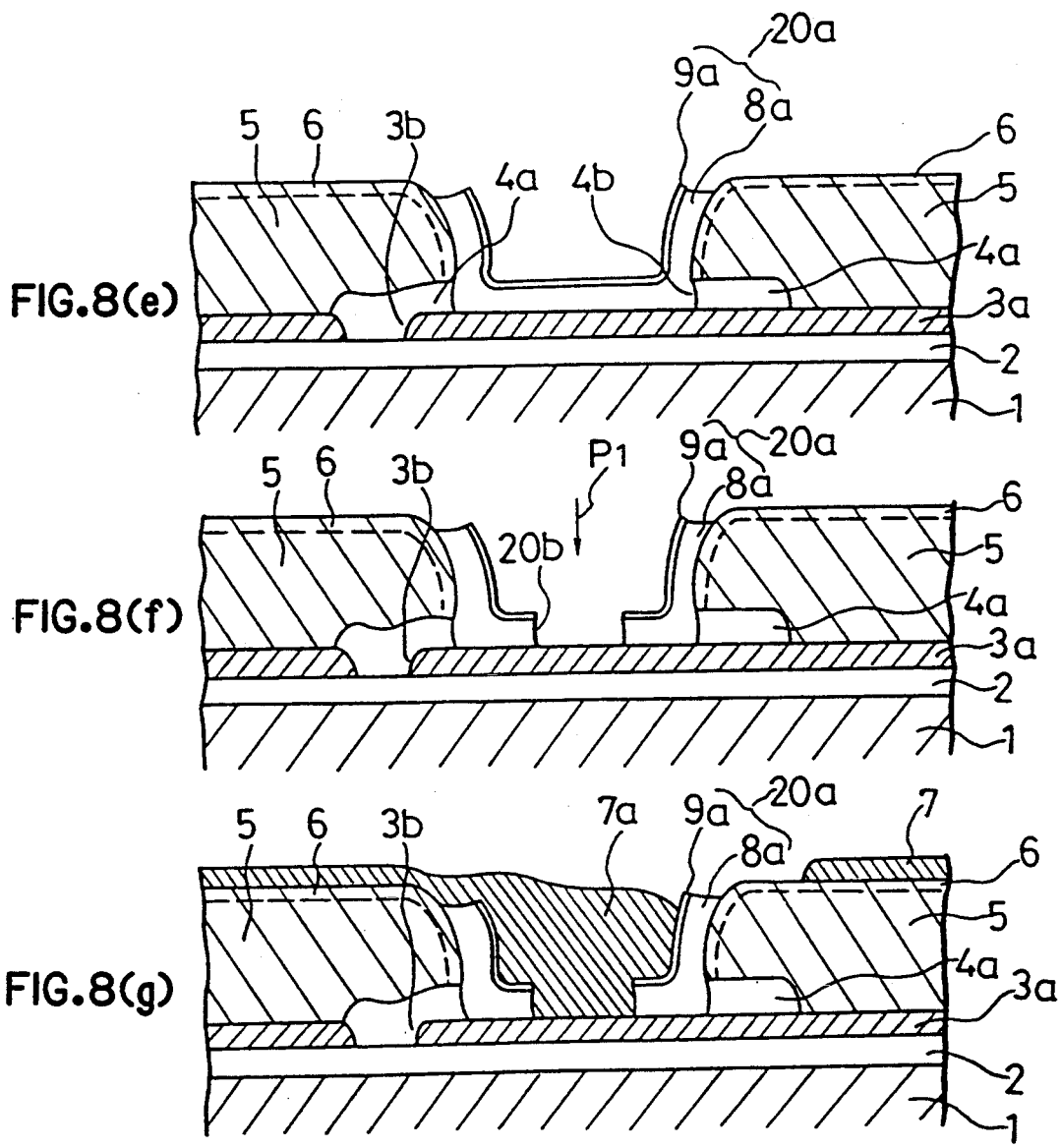

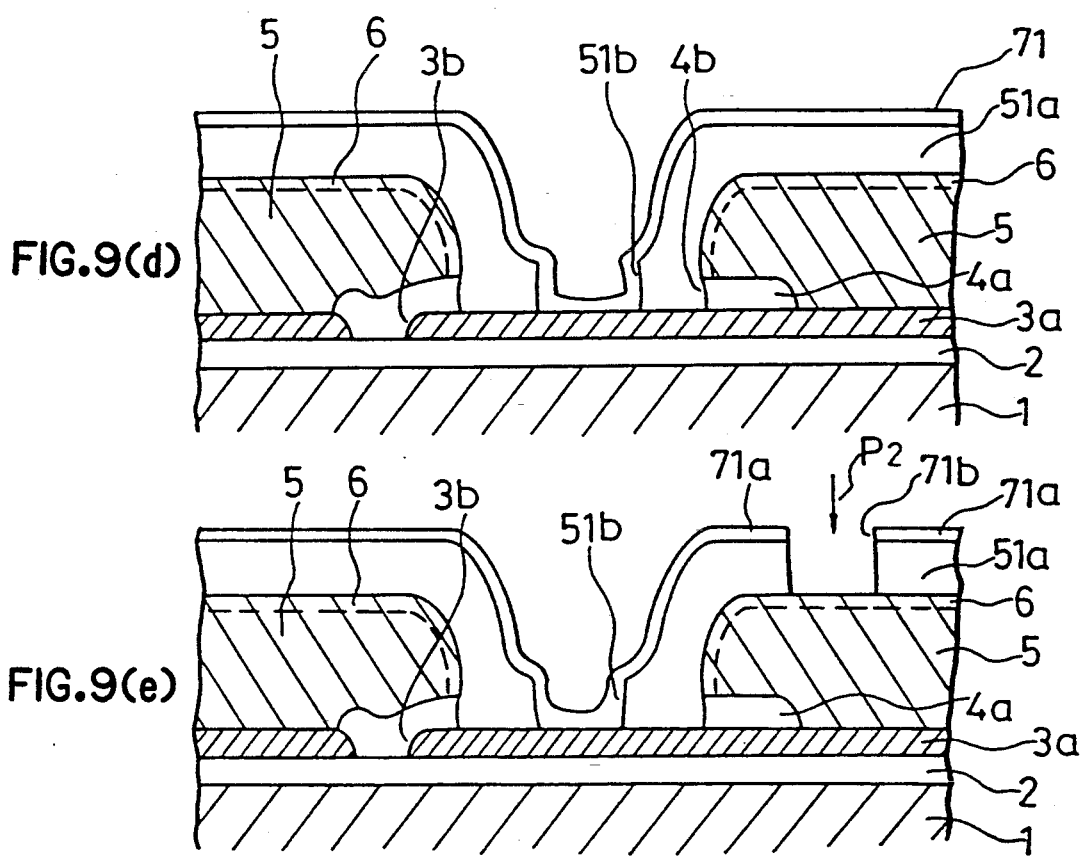

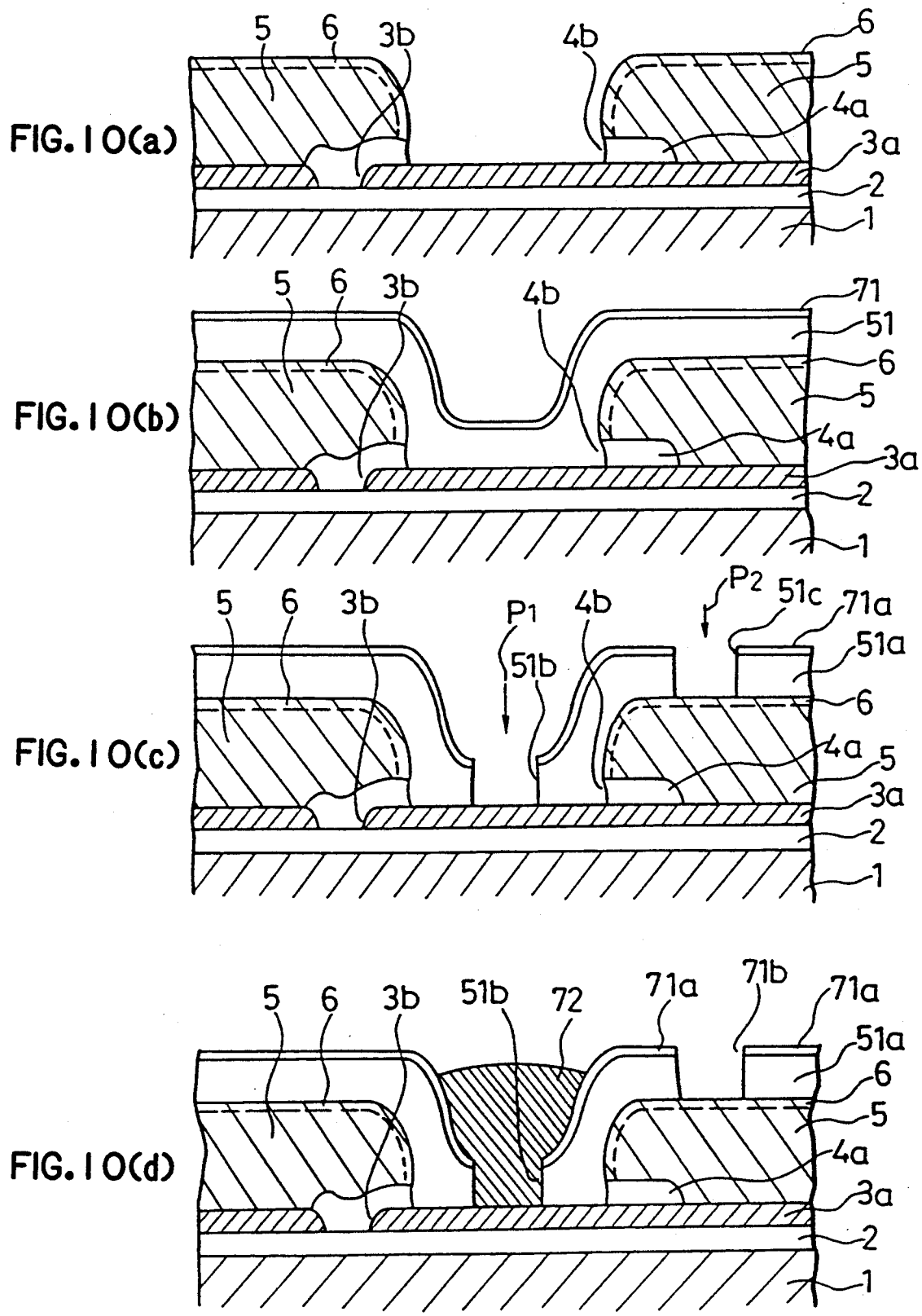

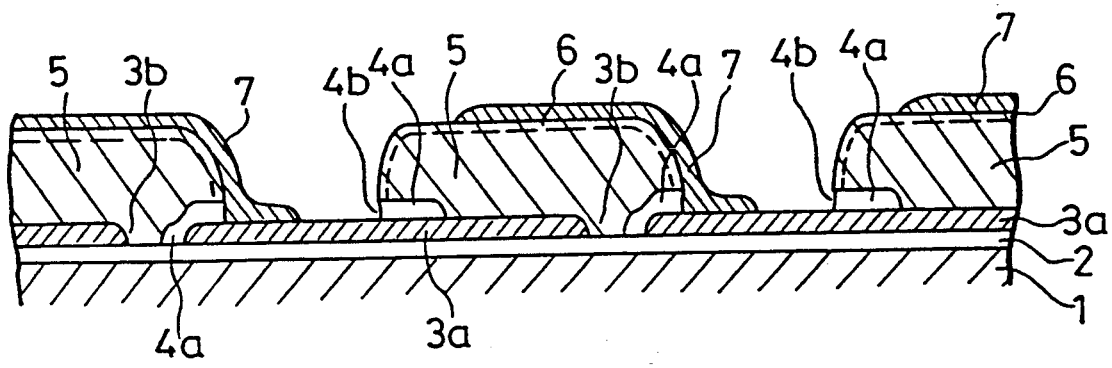
F I G. 11
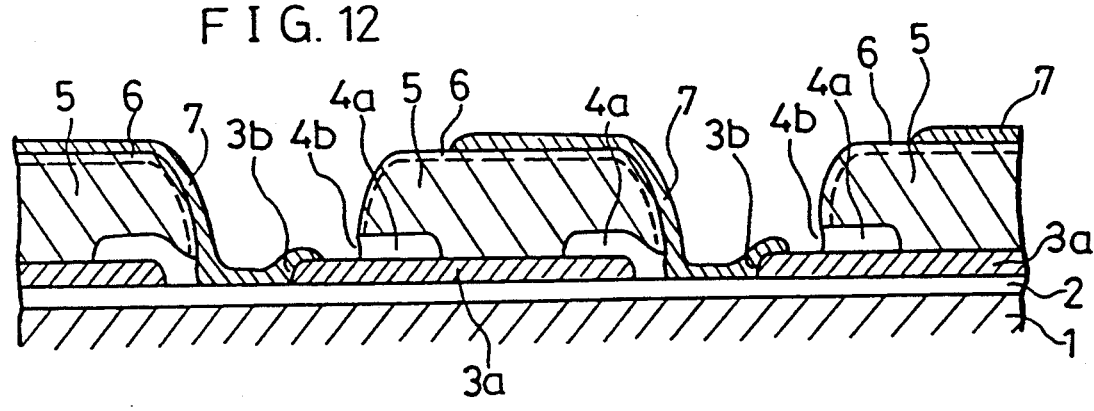
F I G. 12
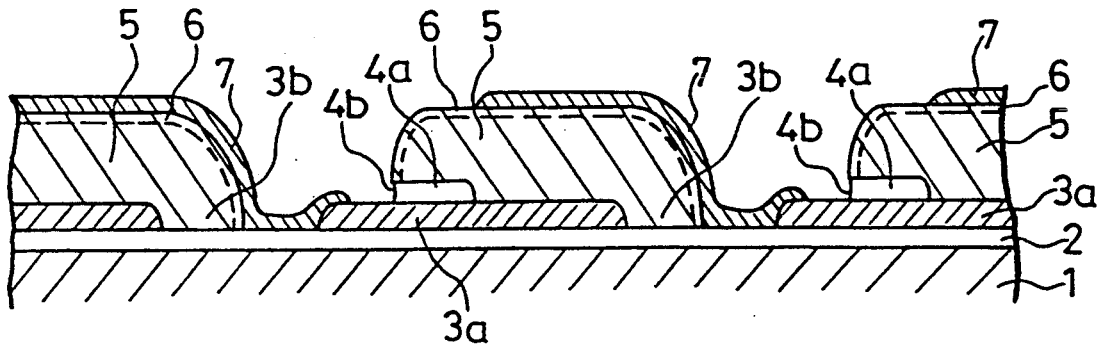
F I G. 13

PHOTOVOLTAIC SEMICONDUCTOR DEVICE AND METHOD FOR MANUFACTURING THE SAME

FIELD OF THE INVENTION

The present invention relates to a semiconductor device and a method for manufacturing the same and, more particularly, to a photovoltaic device using a semiconductor thin film and technique for manufacturing the same.

BACKGROUND OF THE INVENTION

A conventional semiconductor device such as a solar cell has a structure in which a plurality of photovoltaic elements are arranged on a substrate and they are connected to each other in series as shown in Japanese Published Patent Application 59-167072, Japanese Published Patent Application 59-182578, and Japanese Published Patent Application 61-50381.

Conventional techniques for making a photovoltaic device using a semiconductor thin film will be described in detail hereinafter. FIGS. 14(a) to 14(f) are schematic sectional views showing manufacturing steps of the conventional semiconductor device using a semiconductor thin film, which is described in the above Japanese Published Patent Application 59-182578.

In FIG. 14(f), reference numeral 101 designates an insulating substrate. A first electrode layer 113a is selectively formed on the substrate 101. A semiconductor layer 115a formed of a semiconductor thin film is formed on the electrode layer 113a. A second electrode layer 117a is formed on the semiconductor layer 115a. The semiconductor layer 115a and the electrode layers 113a and 117a form one unit photovoltaic element.

Next, its manufacturing method will be described.

Referring to FIG. 14(a), the first electrode layer comprising ITO (indium tin oxide), tin oxide or the like is formed on the insulating substrate 101 of glass. Then, referring to FIG. 14(b), the first electrode layer 113 is divided into predetermined patterns by irradiation with a laser beam. Then, referring to FIG. 14(c), semiconductor thin films are formed thereon as the semiconductor layer 115. In this case, the semiconductor layer 115 is formed by depositing a thin film of amorphous silicon, microcrystalline silicon, an alloy of amorphous silicon and carbon or the like. For example, thin films of p type amorphous silicon, i type amorphous silicon and n type amorphous silicon are used. Then, referring to FIG. 14(d), some portions of the semiconductor layer 115 are removed by means such as laser beam irradiation or etching according to the pattern of the first electrode 113a thereby forming the openings 115b. Then, referring to FIG. 14(e), the structure is covered with the second electrode layer 117 of metal such as aluminum. Then, referring to FIG. 14(f), the structure is processed by such as a laser beam to form the openings 117b.

As described above, there is provided a structure in which the semiconductor layer 115a is provided at each of element regions on the insulating substrate 101, that is, at each of regions on which a unit photovoltaic element is to be formed and this semiconductor layer 115a is sandwiched by the first electrode layer 113a and the second electrode layer 117a. The first electrode layer 113a under the semiconductor layer 115a at each region is connected to the second electrode 117a on the semiconductor layer 115a at the adjacent region.

According to the photovoltaic element of the above structure, if the semiconductor layer 115a has a structure which consists of p type, i type, and n type amorphous silicon thin films, when light irradiates the semiconductor layer 115a through the insulating substrate 101 of glass, the semiconductor layer 115a an generates electromotive force. This electromotive force is generated in the direction of the film thickness so that the p type film may have a positive potential and the n type film may have a negative potential. In addition, since the electrode of the n type side of the semiconductor layer 115a of the unit photovoltaic element is connected to the electrode on the p type side of the semiconductor layer 115a of the adjacent element, the electromotive force generated at the semiconductor layer 115a of each element is added, whereby a high voltage can be generated as a whole. In addition, the amount of current generated can be adjusted by the area of the semiconductor layer 115a of each element.

When the semiconductor layer 115a is formed of a material such as amorphous silicon which can be formed at a relatively low temperature of approximately 300° C. at most, materials of the insulating substrate 101, the first electrode layer 113a and the second electrode layer 117a and their processing means can be selected from a wide range. As a result a structure in which the semiconductor layers 115a arranged on the insulating substrate 101 at predetermined intervals are connected in series by the electrode layers 113a and 117a can be easily obtained as described above.

However, when noncrystalline silicon is used, the conversion efficiency of incident light is converted to electrical energy is low and the conversion efficiency degrades with light exposure. Therefore, crystalline silicon is preferably used as the material of the semiconductor layer 115a.

Meanwhile, when the semiconductor layer 115a is formed of crystalline silicon, processing at a high temperature from approximately 600° C. to 1400° C. which is close to the melting point of silicon has to be performed. In this case the insulating substrate 101, the first electrode layer 113 and the second electrode layer 117 should be formed of materials which can endure the high temperature, so that the choice of materials is limited. In addition, a constituent of the material could diffuse into the silicon crystal as an impurity during processing at a high temperature, which could degrade the performance of the semiconductor device. Thus, it is difficult to produce the above integrated structure using crystalline silicon.

Meanwhile, some efforts have been made to provide a photovoltaic semiconductor device by forming a thin film of crystalline silicon on a substrate. For example, FIGS. 15 and 16 are views showing the structures of semiconductor devices shown in the Conference-Record of the 20th IEEE Photovoltaic Specialists Conference. In FIGS. 15 and 16, reference numeral 111 designates a high-temperature-resistant substrate. A diffusion blocking layer 102 is formed on the substrate 111. A semiconductor layer 105 is formed on the whole surface of the substrate 111 and the blocking layer 102. An emitter layer 106 is formed on the semiconductor layer 105. A metal electrode 107 is formed on the surface.

As the high-temperature-resistant substrate 111, a low purity polycrystalline silicon substrate is used in the structure shown in FIG. 15 and a conductive ceramic is used in the structure shown in FIG. 16, respectively.

According to the conventional example shown in FIG. 15, the diffusion blocking layer 102 comprising a silicon dioxide film is formed on the high-temperature-resistant substrate 111 and then the openings 102a are formed therein in order to electrically connect the high-temperature-resistant substrate 111 to the semiconductor layer 105. More specifically, the high-temperature-resistant substrate 111 serves as an electrode for extracting the current which is generated when light irradiates the semiconductor thin film 105. The semiconductor layer 105 comprising a polycrystalline silicon thin film is formed thereon by chemical vapor deposition method. Since the polycrystalline silicon thin film formed by the chemical vapor deposition method consists of small crystal grains, this is once melted by infrared heating and then recrystallized. Thereafter, the emitter layer 106 is formed on the surface by impurity diffusion and then the metal electrode 107 is formed.

According to this structure, the blocking layer 102 prevents an impurity which could degrade the performance of the semiconductor device from diffusing from the high-temperature-resistant substrate 111 into the semiconductor layer 105 during the recrystallization and also reflects light which enters the semiconductor layer 105 but is not completely absorbed in it and then introduces the light to the semiconductor layer 105 again. However, since the opening 102a is formed in the blocking layer 102, impurities contained in the high-temperature-resistant substrate 111 diffuse into the semiconductor layer 105 through the opening 102a when the semiconductor layer 105 is recrystallized, with the result that the performance of the semiconductor device is degraded.

In addition, according to the conventional example shown in FIG. 16, the blocking layer 102 is formed on the whole surface of the heat resistant substrate 111 comprising a conductive ceramic and then the polycrystalline silicon thin film is formed thereon as the semiconductor thin film 105 by the solution growth method using tin as a solvent. Then, similar to FIG. 15, the emitter layer 106 and the metal electrode 107 are formed.

In this example, although the material of the blocking layer 102 is not specified, the blocking layer 102 should be formed of a conductive material in order to electrically connect the semiconductor thin film 105 to the high-temperature-resistant substrate 111 as in FIG. 15. Therefore, it should be formed of metal or the like. In general, when a metal impurity group enters into the silicon semiconductor, it exerts bad influences on electrical characteristics of the semiconductor of silicon. Meanwhile, when the semiconductor layer 105 is formed on the blocking layer 102 by the solution growth method, the growth temperature must be a high temperature of around 1000° C. Therefore, in this case also, the impurities contained in the material of the blocking layer 102 diffuse into the semiconductor layer 105 while the semiconductor layer 105 is formed, degrading performance of the semiconductor device.

In addition, according to the conventional semiconductor devices shown in FIGS. 15 and 16, since the high-temperature-resistant substrate 111 is used as an electrode for extracting the current generated in the semiconductor layer 105, the high-temperature-resistant substrate 111 has to be formed of a conductive material. Since the high-temperature-resistant substrate 111 is uniformly connected to the semiconductor layer 105 over the whole surface, it is substantially impossible to implement the integrated structure shown in FIG. 14 in which the unit photovoltaic elements are connected in series.

Since the conventional semiconductor device is constructed as described above, it is difficult to implement an integrated structure using a semiconductor material such as crystalline silicon. In addition, impurities diffuse into the semiconductor thin film from the substrates or the metal layers which contact the semiconductor film.

SUMMARY OF THE INVENTION

The present invention was made to solve the problems described above and it is an object of the present invention to provide a semiconductor device comprising a plurality of unit photovoltaic elements and having high conversion efficiency, whose characteristics are not likely to be degraded with light exposure.

It is another object of the present invention to provide a method for manufacturing the above semiconductor device.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

A semiconductor device in accordance with the present invention comprises a plurality of unit photovoltaic elements connected to each other in series. Each unit photovoltaic element comprises a first semiconductor layer having low resistivity and formed on a high-temperature-resistant insulating substrate at predetermined intervals, a second semiconductor layer formed on the first semiconductor layer so that a part of the first semiconductor layer may be exposed and the second semiconductor layer is not in contact with first semiconductor layer of the adjacent unit photovoltaic element, and an electrode layer formed on the second semiconductor layer so that it reaches the first semiconductor layer of the adjacent unit photovoltaic element.

A method for manufacturing a semiconductor device comprises a first step of selectively forming a plurality of first semiconductor layers on a heat resistant insulating substrate at predetermined intervals, a second step of forming an insulating layer on a gap region between the adjacent first semiconductor layers on the insulating substrate so that a part of the insulating layer reaches a peripheral part of one or both of the semiconductor layers, a third step of selectively forming a second semiconductor layer on the first semiconductor layer according to the pattern of the first semiconductor layers, a fourth step of forming an opening at a part of the insulating layer on the first semiconductor layer and a fifth step of forming an electrode layer on the second semiconductor layer so that it reaches and contacts the first semiconductor layer of the adjacent unit photovoltaic element through the opening of the insulating layer.

According to the present invention, since a high-temperature-resistant insulating substrate is used as a substrate on which a unit photovoltaic element is formed and a semiconductor layer is used as a lower side electrode of the photovoltaic element, processing at a high temperature can be performed after the lower side electrode is formed on the substrate and then a semiconductor material which needs high temperature processing, such as crystalline silicon, can be used as the material of the photovoltaic layer. In addition, since the substrate is an insulating substrate and the lower side electrode is formed of a semiconductor material, detrimental impurities are prevented from diffusing into the semiconductor layer formed thereon and it is possible to provide a photovoltaic device having an integrated structure, in which the conversion efficiency is high and the characteristics ar not likely to be degraded.

BRIEF DESCRIPTION OF THE DRAWINGS

FIGS. 6(a)–6(i), 7(a)–7(f), 8(a)–8(g), 9(a)–9(c), and 10(a)–10(d), are schematic sectional views showing manufacturing methods of the semiconductor devices in accordance with first, second, third, fourth, and fifth embodiments of the present invention, respectively;

FIGS. 11, 12 and 13 are schematic views showing variations of the second embodiment of the present invention;

DETAILED DESCRIPTION OF PREFERRED EMBODIMENTS

An embodiment of the present invention will be described in detail in reference to the drawings hereinafter.

Figure 1:
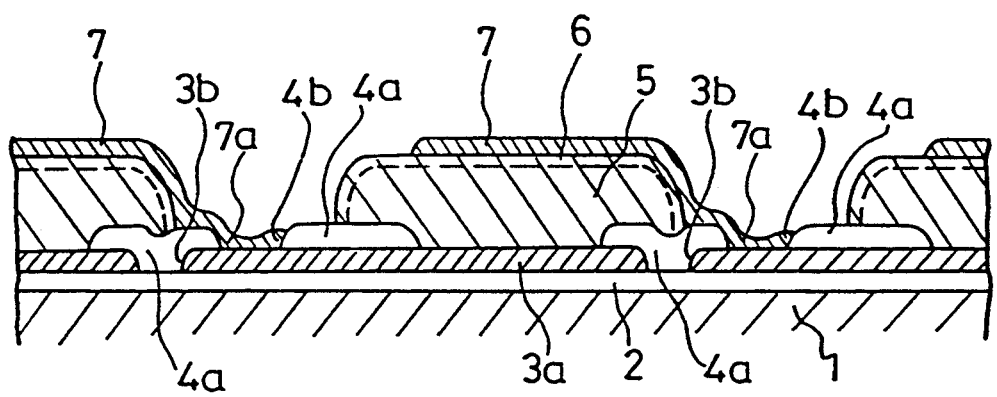
FIGS. 1, 2, 3, 4 and are sectional views showing structures of semiconductor devices in accordance with first, second, third, fourth, and fifth embodiments of the present invention, respectively.

FIG. 1 is a sectional view showing a structure of a semiconductor device in accordance with a first embodiment of the present invention. FIGS. 6(a) to 6(i) are schematic sectional views showing a method for manufacturing the semiconductor device of FIG. 1.

In FIG. 1, reference numeral 1 designates a high-temperature-resistant supporting substrate. An insulating coating layer 2 is formed on -the supporting substrate 1. A first semiconductor layer 3a is formed on the insulating coating layer 2 and is one of to a plurality of unit photovoltaic elements on the supporting substrate 1. An insulating layer 4a is formed on a gap region 3b between the adjacent first semiconductor layers 3a so as to cover the peripheral parts of the semiconductor layers 3a and has an opening 4b on one of the adjacent semiconductor layers 3a. One second semiconductor layer 5 is formed on the first semiconductor layer 3. The ends of the second semiconductor layer 5 extend onto the insulating layer 4a a little. A junction layer 6 is formed on the surface of the second semiconductor layer 5. An electrode layer 7 is formed on the junction layer 6 contacting the first semiconductor layer 3a of an adjacent element region via the opening 4b of the insulating layer 4a.

The high-temperature-resistant supporting substrate 1 may be formed of any material if it has sufficient mechanical strength at a temperature required when the semiconductor layers 3 and 5 are formed. For example, quartz, ceramics, carbon, a refractory metal or silicon can be used. When an electrically conductive material such a carbon or a refractory metal is used as the supporting substrate 1, its surface is covered with the insulating coating layer 2 as described above and then this coating is used as the insulating substrate. On the other hand, when an insulating material such as quartz or ceramic is used as the supporting substrate 1, this material can be used as the insulating substrate as it is. However, even when the insulating material is used as the supporting substrate 1, if it contains detrimental impurities which could degrade the performance of the semiconductor device, the substrate should be covered with the insulating coating layer 2 so as to prevent the impurities from diffusing into the semiconductor layers 3 and 5.

In addition, as the insulating coating layer 2, for a silicon dioxide layer or alumina can be used. For example, as the supporting substrate 1, metallurgical grade silicon having low purity is used and it may be covered with a silicon dioxide layer as the insulating coating layer 2. Alternatively, as the insulating coating layer 2, an alumina layer, a double coating layer of alumina and silicon dioxide or the like may be used.

Next, a manufacturing method will be described.

Figure 6A:
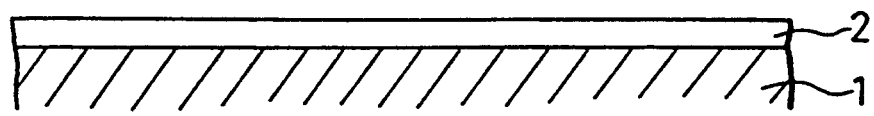

Referring to FIG. 6(a), the insulating coating layer 2 is formed on the supporting substrate 1.

Figure 6B:
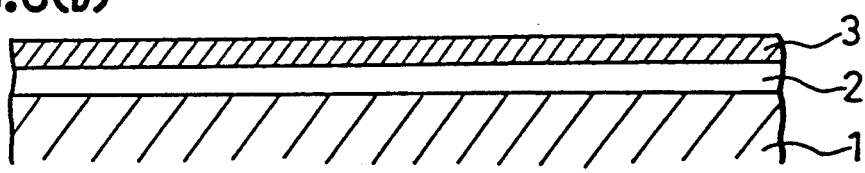
Figure 6C:
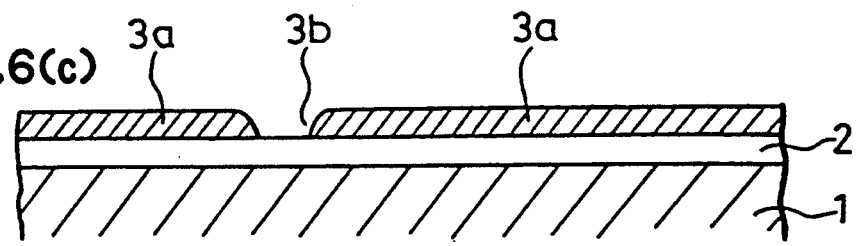

Then, referring to FIG. 6(b), the first semiconductor layer 3, for example an n type polycrystalline silicon thin film having low resistivity is formed on the insulating coating layer 2 by a chemical vapor deposition method. Then, referring to FIG. 6(c), the first semiconductor layer 3 is divided into a plurality of units according to a predetermined pattern by means such as etching or laser beam scribing thereby providing the first semiconductor layers 3a.

Figure 6D:
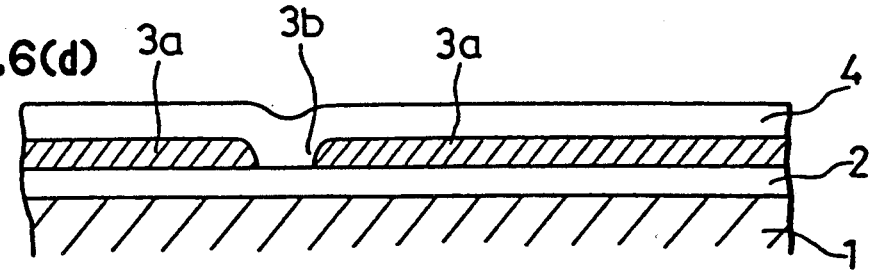

Then, referring to FIG. 6(d), the insulating layer 4 such as silicon dioxide film is applied thereto by a chemical vapor deposition method. At this time, a silicon nitride film may be further applied thereto. In this state, processing such as recrystallization using laser beam irradiation or ZMR (Zone Melting Recrystallization) using a carbon strip heater or a IR (Infrared Rays) lamp heater may be applied to the first semiconductor layer 3a. The patterning of the first semiconductor layer S in FIG. 6(c) may be performed after the recrystallization. In this case, the insulating layer 4 is removed after the recrystallization and then the insulating layer 4 is applied again after the patterning.

Figure 6E:
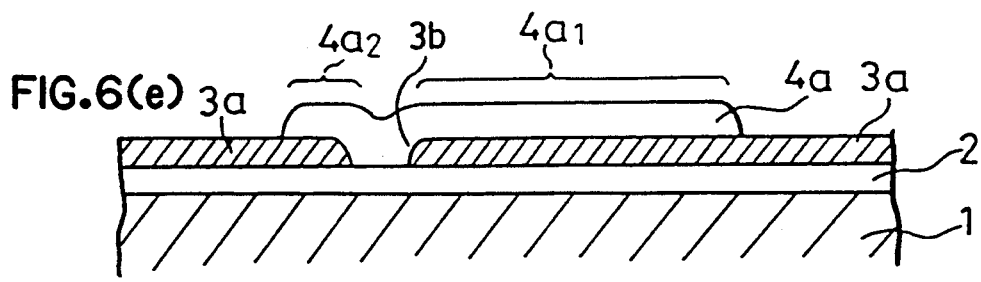

Then, referring to FIG. 6(e), the insulating layer 4 is etched away except for a gap region 3b between the adjacent first semiconductor layers 3a and peripheral parts of the first semiconductor layers 3a around the gap region 3b. At this time, as shown in FIG. 6(e), the width of a part $4a_1$ covered with the insulating film 4a which is the peripheral part of one of two adjacent first semiconductor layers 3a is wider than that of a covered part $4a_2$ which is the peripheral part of the other adjacent first semiconductor layer.

Figure 6F:
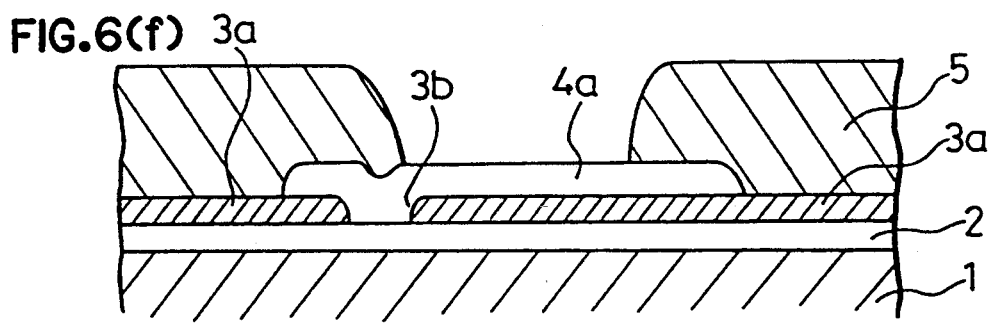

Then, referring to FIG. 6(f), the second semiconductor layer 5 is selectively formed thereon. More specifically, the second semiconductor layer 5 is only formed where the first semiconductor layer 3a is exposed and the second semiconductor layer 5 is not formed on the part covered with the insulating layer 4a. For example, in a case where the first and second semiconductor layers 3a and 5 are formed of polycrystalline silicon and the insulating layer 4a is formed of silicon dioxide, the second semiconductor layer 5 can be formed by a chemical vapor deposition method, introducing HCl in the deposition gases. The solution growth method using tin as a solvent also can be used. By these methods, the second semiconductor layer 5 is not grown from a surface of the insulating layer 4a. Rather, the second semiconductor layer 5 is grown from the exposed part of the first semiconductor layer 3a onto the insulating layer 4a as shown in FIG. 6(f). The second semiconductor layer 5 may be formed on the whole surface and be divided by etching the part of the second semiconductor layer 5 on the insulating layer 4a corresponding to the pattern of the first semiconductor layers 3a in order selectively to form the second semiconductor layer 5. For example, the second semiconductor layer 5 is formed of an n type polycrystalline silicon.

Figure 6G:
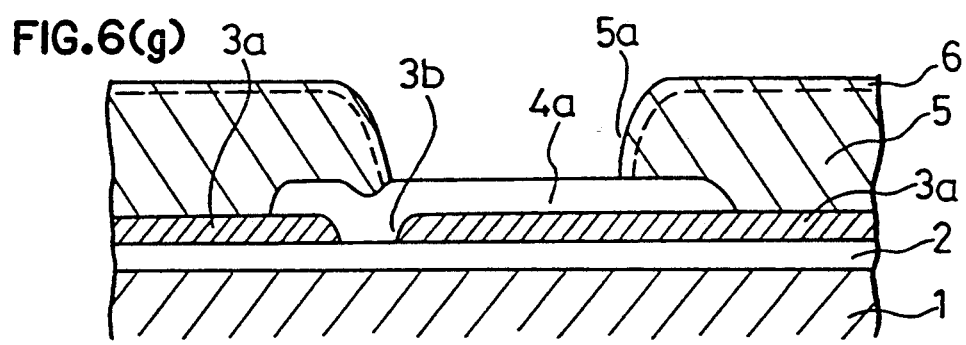

Then, referring to FIG. 6(g), the junction layer 6 is formed on a surface of the second semiconductor layer 5 by a method such as impurity diffusion or by forming an amorphous or microcrystalline thin layer. For example, when the second semiconductor layer 5 is formed of n type polycrystalline silicon, p type impurity diffusion of boron or the like is performed.

Figure 6H:
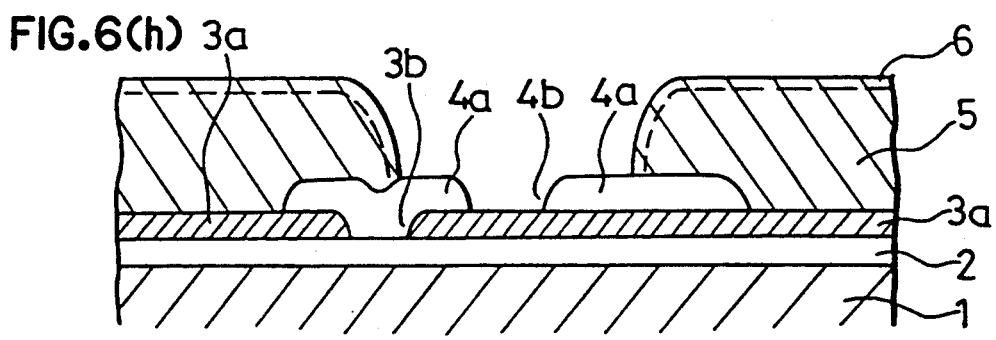
Figure 6I:
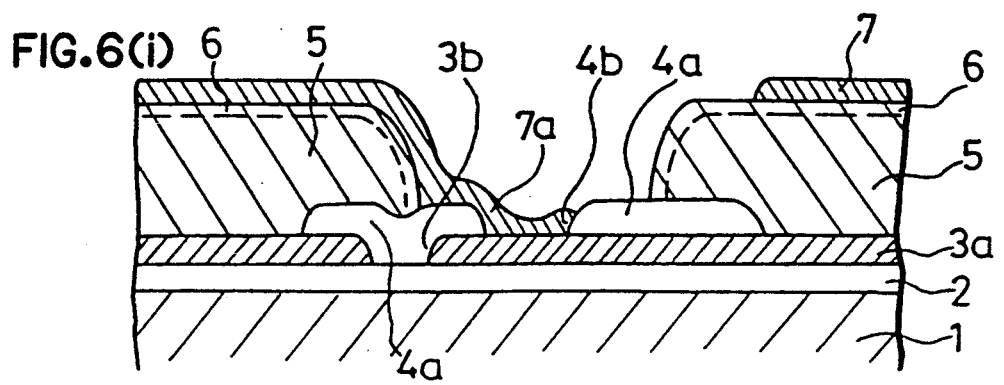

Then, referring to FIG. 6(h), a part of the exposed insulating layer 4a in the gap region 5a between the adjacent second semiconductor layers 5 is etched away thereby forming the opening 4b. Finally, referring to FIG. 6(i), the electrode layer 7 comprising, for example, aluminum is formed on the junction layer 6 so that it contacts the first semiconductor layer 3a via the opening 4b of the insulating layer 4a. If the electrode layer 7 is formed of a material which does not transmit light, such as aluminum or metal paste, it is usually formed in a grid electrode having a fishbone-shaped or a stripe-shaped pattern. In addition, the first semiconductor layer 3a of low resistivity serves as the lower side electrode opposite to the electrode layer 7 with the second semiconductor layer as the photovoltaic layer 5 between.

According to this embodiment of the present invention, the high-temperature-resistant insulating substrate 1 is used as a substrate of the photovoltaic element and the semiconductor layer 3a is used as a lower side electrode of the element. Therefore, processing can be performed at a high temperature after the lower side electrode is formed on the substrate. For example, a semiconductor material which needs high temperature processing, such as crystalline silicon, can be used as the material of the photovoltaic layer. In addition, since the substrate is made of insulating material or is coated with the insulating layer 2 and the first semiconductor layer 3a serves as the lower side electrode, it is possible to use a high temperature process without the problems of diffusion of detrimental impurities into the semiconductor layer 5 formed on the substrate 1 and layer 3a. As a result, an integrated structure in which the unit photovoltaic elements are connected to each other in series can be obtained using the semiconductor material such as crystalline silicon.

In addition, according to a method of this embodiment, since the supporting substrate 1 is covered with the insulating coating layer 2 and not used as the electrode of the photovoltaic element and it is not in contact with the semiconductor layers 3a and 5, rather low purity materials can be used for the supporting substrate 1.

In addition, if the supporting substrate 1 is coated with alumina or metal such as silver or aluminum and then it is further coated with a transparent insulating coating layer 2 such as a silicon dioxide film, since the reflectivity of the coating is high, the light which is not absorbed in the semiconductor layers 3a and 5 is effectively reflected and then introduced to the semiconductor layers 3a and 5 again, with the result that performance of the semiconductor device is improved.

Figure 2:
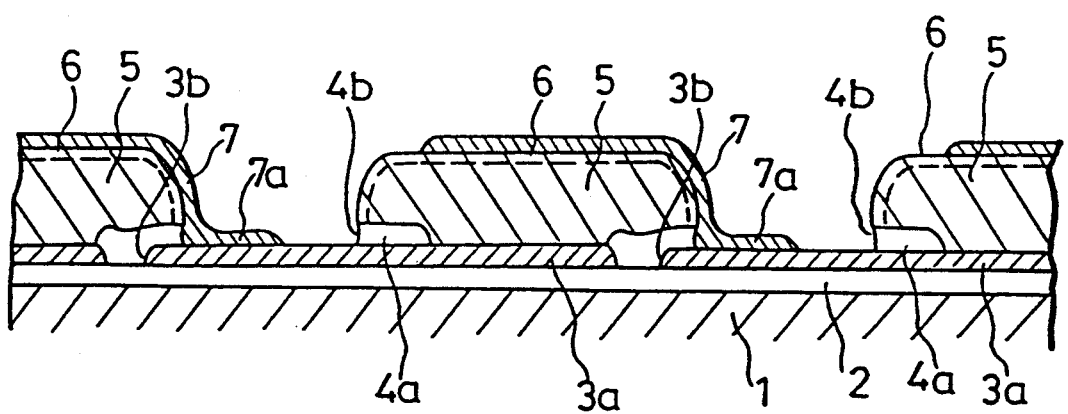

FIG. 2 is a sectional view showing a structure of a semiconductor device in accordance with a second embodiment of the present invention, which further develops the first embodiment of the present invention. FIGS. 7(a) to 7(f) are sectional views showing a manufacturing method for it.

According to this second embodiment of the present invention, the area of a peripheral part of one of the adjacent first semiconductor layers 3a, which is covered with the insulating film 4a is decreased and the opening 4b of the insulating film 4a extends over the whole of the gap region 5a of adjacent second semiconductor layers 5. The structure other than the above feature the same as that of the first embodiment of the present invention.

Next, a manufacturing method will be described hereinafter.

Figure 7A:
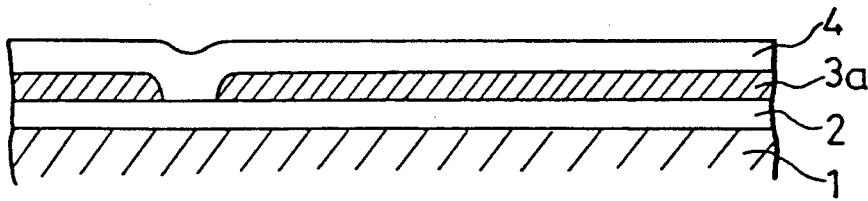
Figure 7B:
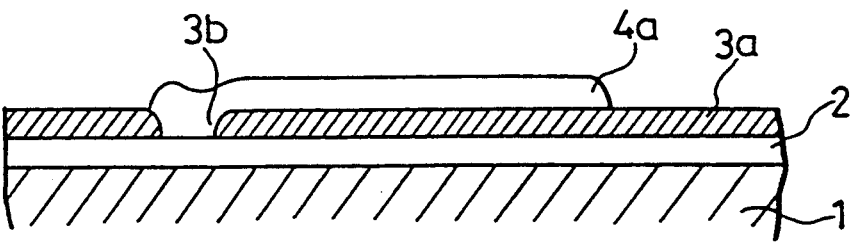
Figure 7C:
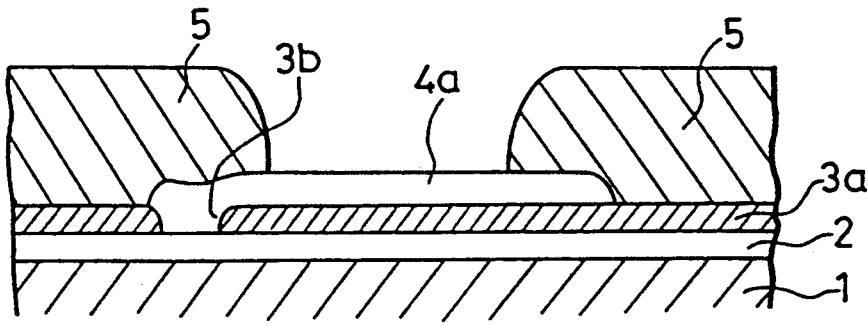

FIG. 7(a) corresponds to FIG. 6(d). Then, referring to FIG. 7(b), the insulating layer 4 is patterned so that a width on the peripheral part, covered with the insulating layer 4a, of one of the first semiconductor layers 3a is narrow. Thus, the second semiconductor layer 5 is selectively formed on the exposed surface of the first semiconductor layers 3a, so that the second semiconductor layer 5 extending onto the insulating layer 4a completely covers the gap region 3b as shown in FIG. 7(c).

Figure 7D:
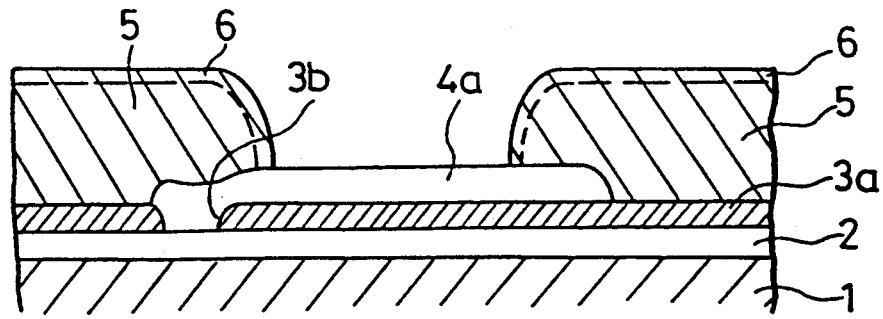

Then, referring to FIG. 7(d), after the second semiconductor layer 5 is formed on the first semiconductor the second semiconductor layer 5 as in FIG. 6(g) and then a part of the insulating layer 4a is etched away to form an opening 4b. Then, referring to FIG. 7(e), the exposed insulating layer 4a at the gap region 5a between the adjacent second semiconductor layers 5 is totally etched away using the second semiconductor layer 5 as a mask because the second semiconductor layer 5 completely covers the gap region 3b of the first semiconductor layer 3a as described above. Thereafter, referring to FIG. 7(f), finally the electrode layer 7 is formed thereby completing the photovoltaic element as in FIG. 6.

According to this second embodiment, since the insulating layer 4 is patterned so that the width of the insulating layer 4a on a peripheral part of one of the first semiconductor layers 3a is narrow, when the opening 4b is formed in the insulating layer 4a, the second semiconductor layer 5 can serve as a mask. As a result, manufacturing steps thereof can be simple as compared with the above-described first embodiment.

Figure 3:
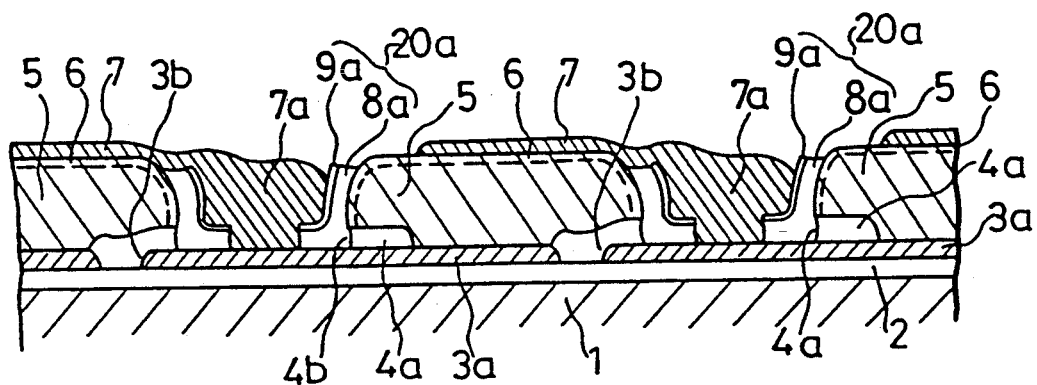

FIG. 3 is a sectional view showing a semiconductor device in accordance with a third embodiment of the present invention, which further develops the second embodiment of the present invention. FIGS. 8(a) to 8(g) are sectional views showing its manufacturing method.

Figure 7E:
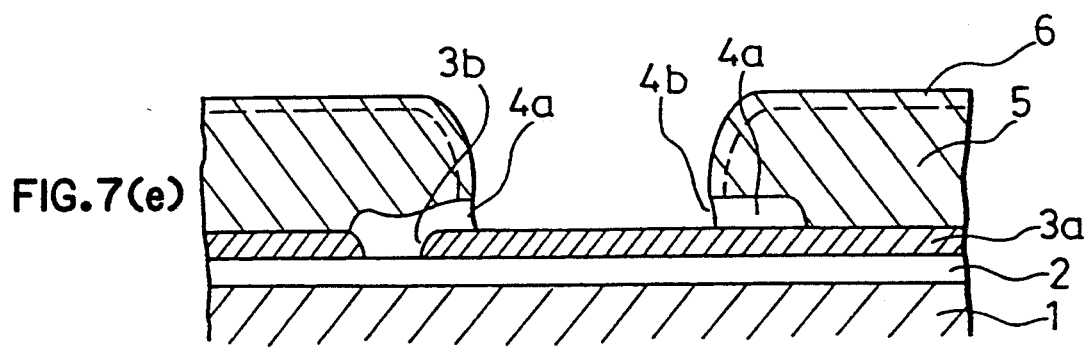
Figure 7F:
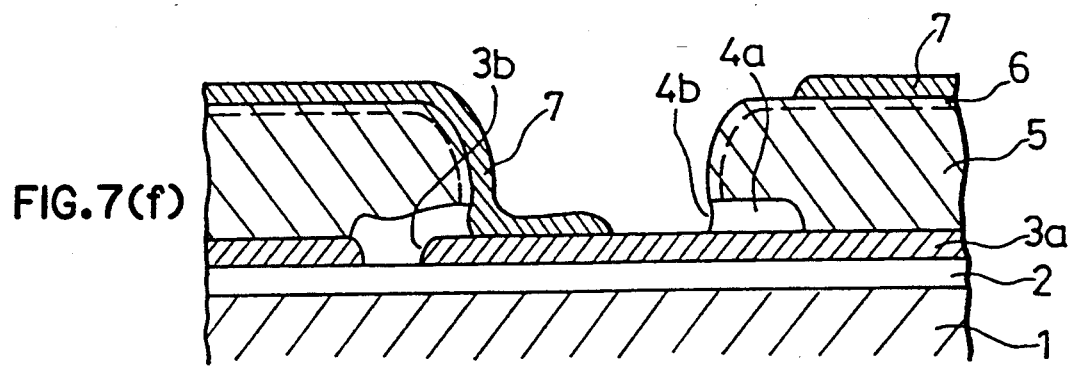
Figures 8A, 8B, 8C, 8D:
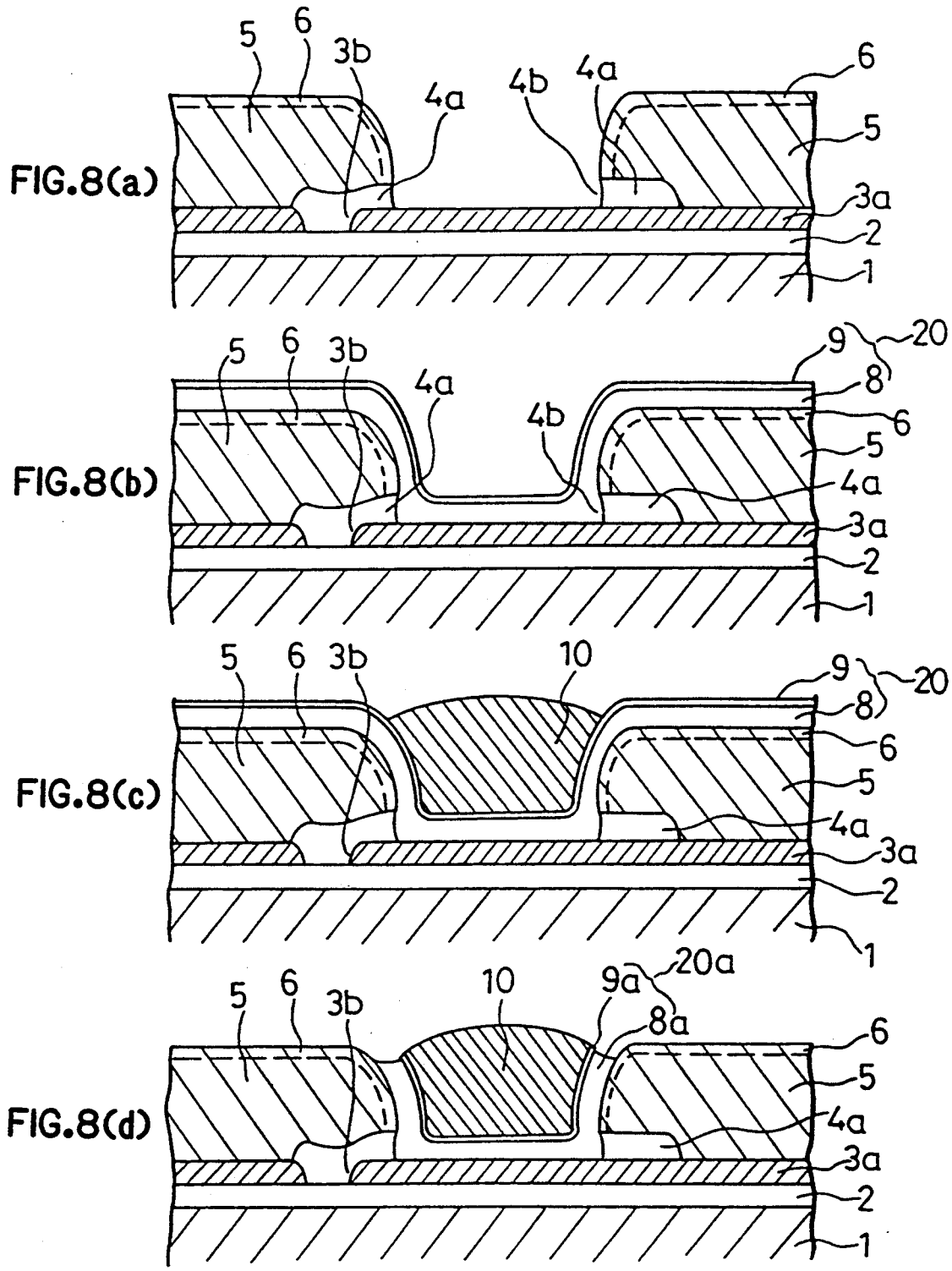

FIG. 8(a) corresponds to FIG. 7(e). In the second embodiment, the electrode layer 7 is directly provided thereon. The electrode layer 7 must be patterned in a concave region with a large difference in level when the electrode layer 7 is formed. In other words, if the electrode layer 7 fills the concave region between the adjacent second semiconductor layers 5, a short-circuit between the second semiconductor layer 5 and the first semiconductor layer 3 is formed and then the function of the semiconductor device is lost. This problem is solved in this third embodiment.

More specifically, referring to FIG. 8(b), the whole surface is covered with a second insulating layer 20 after the insulating layer 4 is etched away (FIG. 8(a)). Although the second insulating layer 20 is formed by forming an amorphous silicon layer 8 and a silicon dioxide layer 9 in this case, it may be formed of only the amorphous silicon layer or another material.

Thereafter, referring to FIG. 8(c), the concave region between the adjacent second semiconductor layers 5 is filled with a resist 10. Then, referring to FIG. 8(d), the second insulating layer 20 is etched away except for the concave region, and referring to FIG. 8(e), the resist 10 is removed.

Then, referring to FIG. 8(f), a position shown by an arrow P$_1$, the bottom of the concave region is irradiated with a laser beam thereby forming an opening 20b in the insulating layer 20a of this region. Then, referring to FIG. 8(g), the concave region is filled with the electrode layer 7 and the electrical connection between the junction layer 6 and the adjacent first semiconductor layer 3a is made to complete structure of the element.

According to this third embodiment, since the electrode layer 7 is formed after the second insulating film 20 is formed on side walls of the second semiconductor layers 5, it does not matter if all of the concave region is filled with a material of the electrode layer 7 as shown in FIG. 8(g). Therefore the electrode layer 7 does not have to be patterned at the concave region between the adjacent second semiconductor layers 5, that is, where there is a large difference in level. As a result, processing control can be simple.

In addition, although the second semiconductor layer 5 consists of only one layer including the junction layer 6 in the above first to third embodiments, another semiconductor layer may be put on the second semiconductor layer 5.

Figure 4:
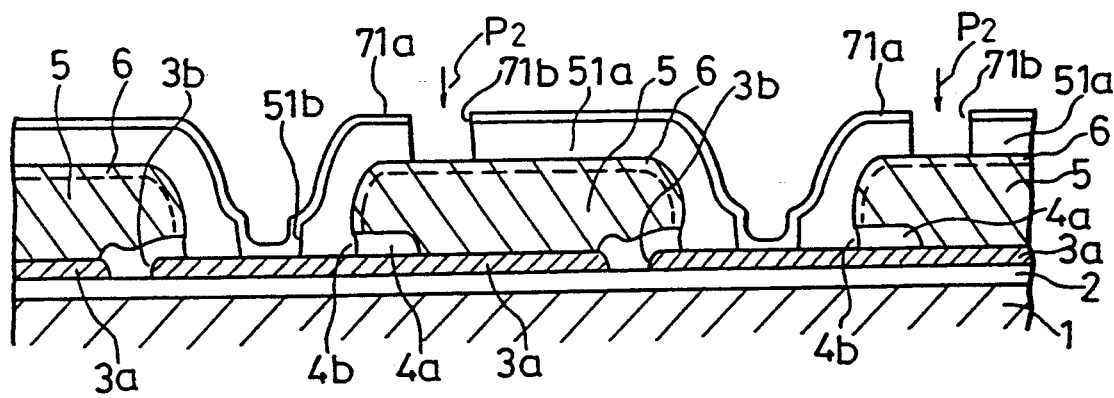

FIG. 4 is a sectional view showing the structure of a semiconductor device in accordance with a fourth embodiment of the present invention. In FIG. 4, an additional semiconductor layer 51a is formed on the junction layer 6 and an electrode layer 71a is formed thereon. Here, the semiconductor layer 5, the junction layer 6 and the additional semiconductor layer 51a are regarded as the second semiconductor layer. The structure of FIG. 4, other than the above feature, is the same as that of the third embodiment of the present invention.

Next, its manufacturing method will be described in reference to FIGS. 9(a)-9(e).

Figure 9A:
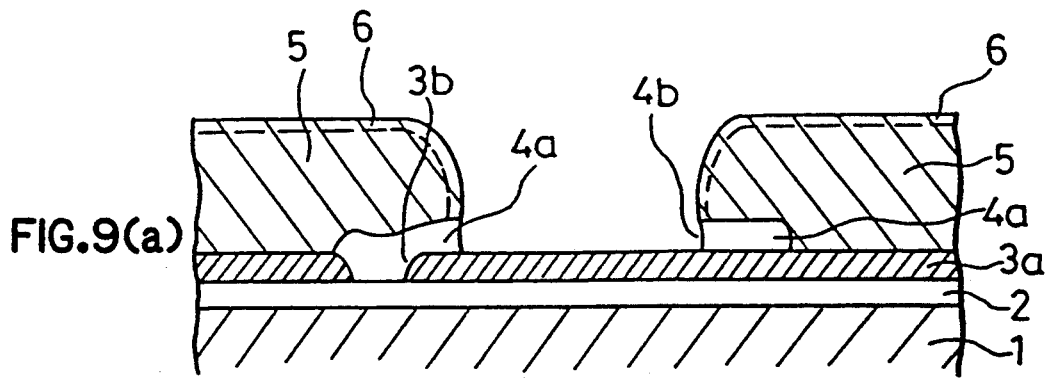
Figure 9B:
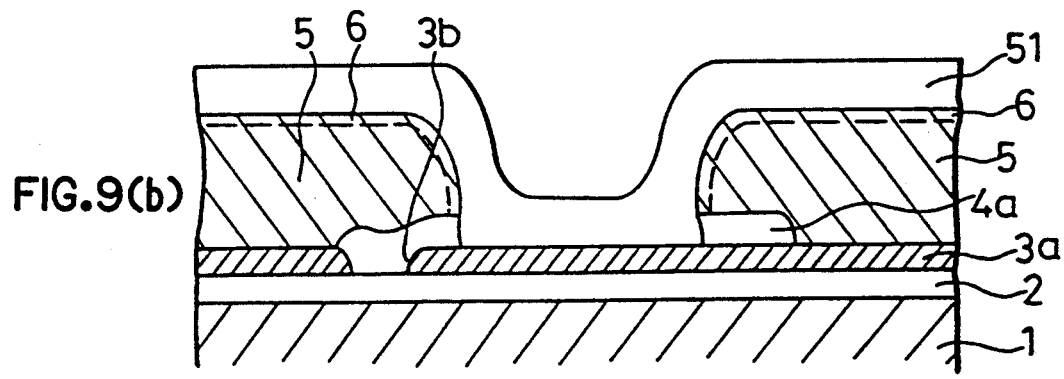

FIG. 9(a) corresponds to FIG. 7(e). Then, referring to FIG. 9(b), the additional semiconductor layer 51 comprising, for example amorphous silicon, is formed on the whole surface. The semiconductor layer 51 of amorphous silicon comprises p type, i type and n type amorphous silicon layers. When the semiconductor layer 5 is formed of, for example n type polycrystalline silicon and the junction layer 6 is formed of p type microcrystalline silicon, n type, i type and p type amorphous or microcrystalline silicon films are sequentially formed as the semiconductor layer 51, and a tandem structure in which a polycrystalline silicon cell and an amorphous silicon cell are stacked is provided. Alternatively, the n type, i type and p type amorphous or microcrystalline silicon films or the like may be sequentially formed two times or more.

Figure 9C:
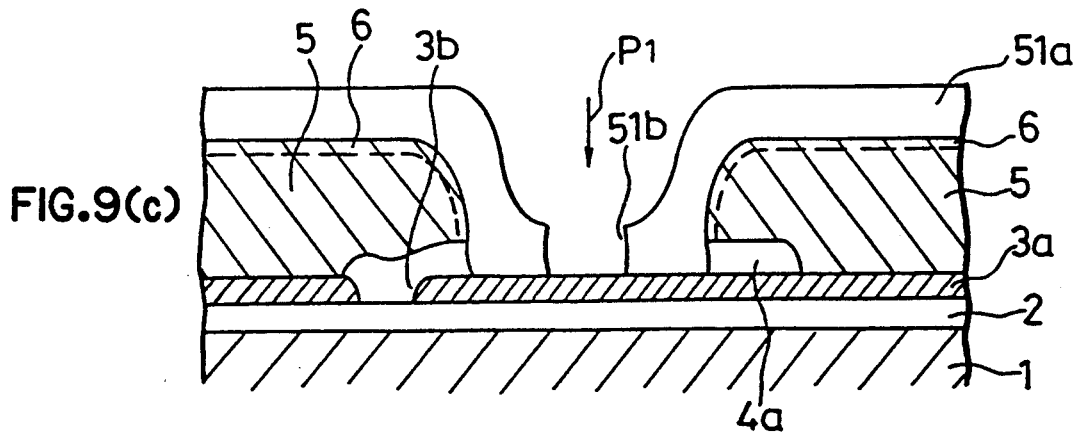
Figure 14:
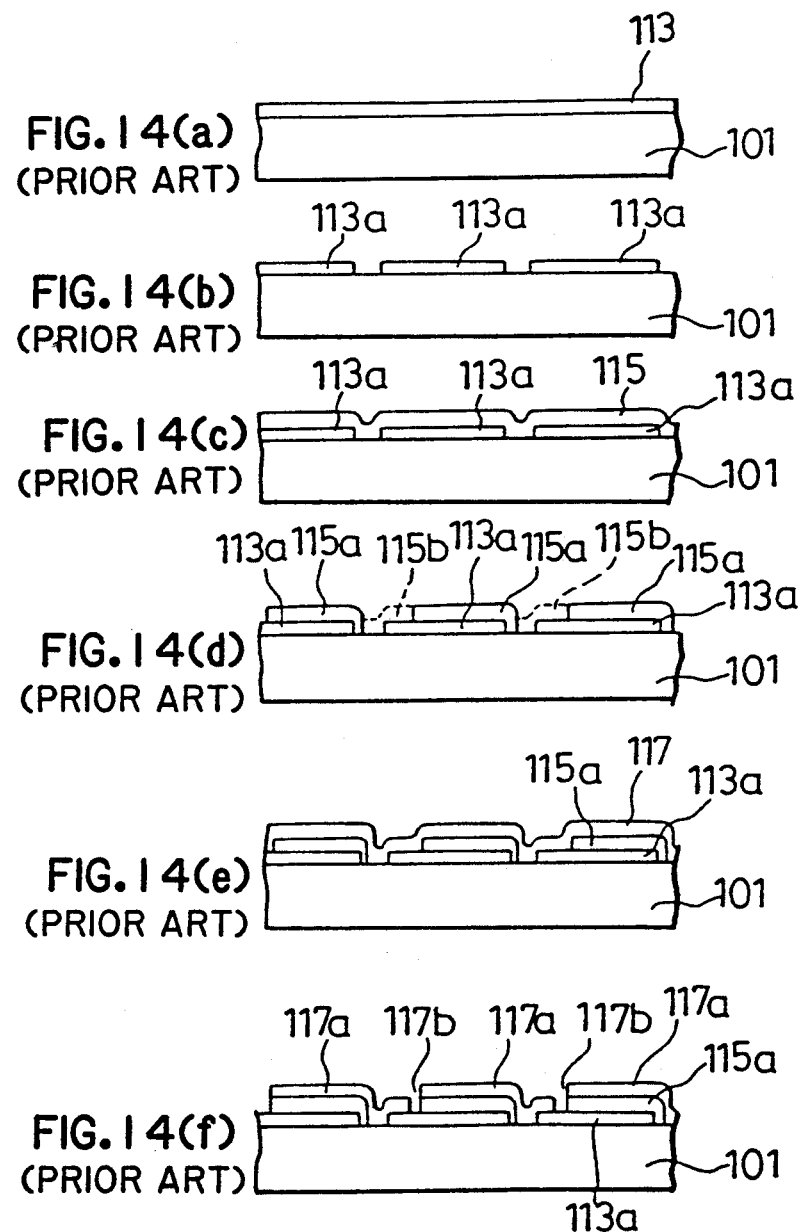
FIGS. 14(a)–14(f), are schematic sectional views showing a conventional semiconductor device and a manufacturing method.
Figure 15:
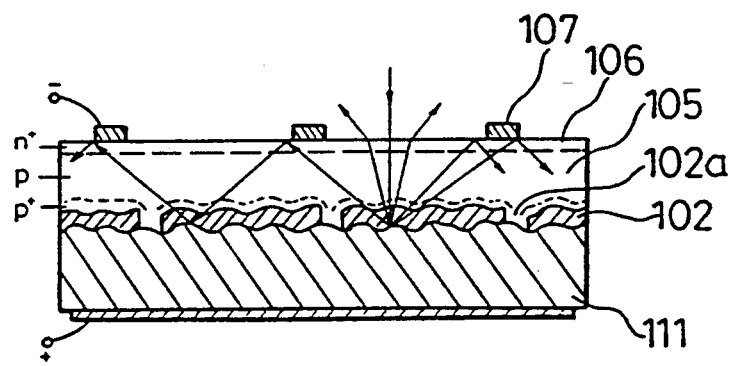
FIGS. 15 and 16 are schematic views showing structures of other conventional semiconductor devices.
Figure 16:
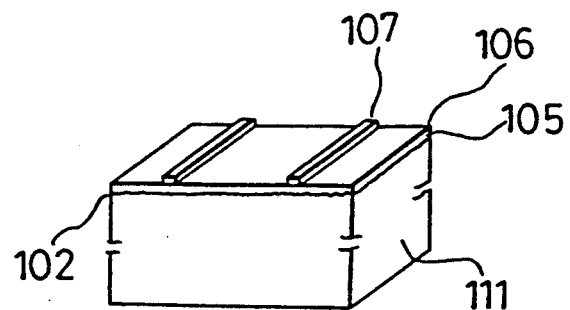

Then, referring to FIG. 9(c), a position shown by an arrow P$_1$ is irradiated with a laser beam to form the opening 51b. Then, referring to FIG. 9(d), the whole surface is covered with the electrode layer 71, which is a transparent conductive film comprising ITO, tin oxide or the like. Then, referring to FIG. 9(e), a position shown by an arrow P$_2$ is irradiated with laser beam to remove the semiconductor layer 51a and the electrode layer 71 at the same time. As a result, there is provided an integrated structure in which the first semiconductor layer 3a of each element is connected to the electrode layer 71a of its an adjacent unit photovoltaic element.

According to this embodiment of the present invention, since the second semiconductor layer which performs photovoltaic conversion consists of two parts of a polycrystalline silicon cell and an amorphous silicon cell, the generated voltage at the unit photovoltaic element can be increased.

Figure 5:
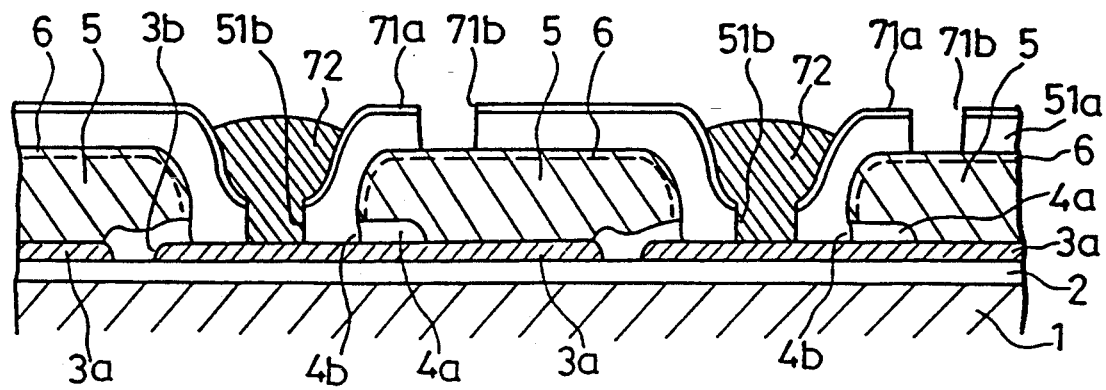

FIG. 5 is a sectional view showing a structure of a semiconductor device in accordance with a fifth embodiment of the present invention and FIGS. 10(a) to 10(d) are sectional views showing a manufacturing method. According to this fifth embodiment, the semiconductor layer 51 and the electrode layer 71 are formed in accordance with the fourth embodiment and thereafter the opening 51b is formed and is filled with a conductive filler 72.

More specifically, referring to FIG. 10(a), the insulating layer 4a is etched away. Then, referring to FIG. 10(b), the semiconductor layer 51 comprising, for example amorphous silicon and the electrode layer 71 comprising, for example ITO or tin oxide, are sequentially formed on the whole surface thereof. Then, referring to FIG. 10(c), positions shown by arrows P$_1$ and P$_2$ are irradiated with a laser beam to form two openings 51b and 51c. Then, referring to FIG. 10(d), the opening 51b at a concave region is filled with the conductive filler 72 such as metal paste and then the first semiconductor layer 3a exposed in the opening 51b is connected to the electrode layer 71. Thus, the integrated structure equivalent to that shown in FIG. 4 can be obtained.

In this case, since the additional semiconductor layer 1 and the electrode layer 71 can be patterned at one time, the number of patterning operations can be reduced as compared with the fourth embodiment.

In addition, although the polycrystalline silicon thin film or the amorphous silicon thin film are mainly used as the first and second semiconductor layers in the above first to fifth embodiments, the material of each part of the semiconductor device and processing means are not limited to those in the above embodiments.

In addition, although the insulating layer 4a is formed on the gap region 3b between the adjacent first semiconductor layers 3a of the unit photovoltaic elements and on the peripheral parts of the first semiconductor layers around the gap region 3b in the above embodiments, the insulating layer 4a may be formed on the peripheral part of the first semiconductor layer 3a on one side of the gap region as shown in FIG. 11.

In addition, according to the second embodiment of the present invention, since the insulating layer 4a is patterned so that its width on the peripheral part of one of the first semiconductor layers 3a adjacent to the gap region 3b is narrow, the second semiconductor layer 5 is spread on the insulating layer 4a over the gap region 3b between the first semiconductor layers 3a when it is selectively formed as shown in FIG. 7(c). However, when the material of the insulating layer 4a is different from that of the insulating coating layer 2 which provides the insulating substrate, that is, in the case that the insulating layer 4 can be selectively removed from the insulating coating layer 2, the second semiconductor layer 5 does not have to cover all of the gap region 3b as shown in FIG. 12. In this case also, the same effect as the above can be obtained.

In addition, when the insulating layer 4a is formed on the gap region 3b of the first semiconductor layers 3a and on the peripheral part of the first semiconductor layers 3a around the gap region 3b, the insulating layer 4a may be provided only on the peripheral part of the first semiconductor layer 3a on one side of the gap region 3b as shown in FIG. 13.

As shown in FIGS. 11 to 13, in these cases the insulating layer 4a may be grown on the semiconductor layer 3a on one side of the gap region 3b or may not, so that the patterning margin of the insulating layer 4 can be increased.

As described above, according to the present invention, since the high-temperature-resistant substrate is used as a substrate on which the photovoltaic elements are formed and the semiconductor layer is used as the lower side electrode of the photovoltaic element, processing can be performed at a high temperature after the lower side electrode is formed on the substrate, with the result that a semiconductor material which can provide high conversion efficiency and needs to be processed at a high temperature, such as crystalline silicon, can be used as the material of the photovoltaic layer. In addition, since the lower side electrode is made of a semiconductor material, there is not a problem such as the diffusion of detrimental impurities into the semiconductor layer formed thereon. Since an insulating substrate is used, there is provided a semiconductor device comprising a plurality of unit photovoltaic elements with high conversion efficiency, whose characteristics are not easily degraded with light exposure.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photovoltaic semiconductor device including:
   a high temperature resistant, electrically insulating substrate;
   a plurality of unit photovoltaic elements disposed on said substrate and connected to each other in series, said photovoltaic elements comprising:
   a plurality of first semiconductor layers, each having a relatively low resistivity, disposed on said substrate spaced apart at a predetermined interval;
   a plurality of second semiconductor layers selectively disposed on respective first semiconductor layers so that part of the respective first semiconductor layer is not covered by the corresponding second semiconductor layer and each respective second semiconductor layer only contacts the respective first semiconductor layer, each second semiconductor layer including a photovoltaic junction; and
   electrodes disposed on respective second semiconductor layers, each electrode contacting a first semiconductor layer adjacent the first semiconductor layer corresponding to the second semiconductor layer on which the respective electrode is disposed.

2. A photovoltaic semiconductor device in accordance with claim 1 including an insulating layer disposed between adjacent first semiconductor layers on said substrate on parts of said adjacent first semiconductor layers, and including an opening at one of said first semiconductor layers, wherein an electrode contacts said first semiconductor layer through the opening in said insulating layer.

3. A photovoltaic semiconductor device in accordance with claim 2 including a second insulating layer disposed beside respective second semiconductor layers.

4. A photovoltaic semiconductor device in accordance with claim 2 wherein a part of said second semiconductor layers is crystalline silicon.

5. A photovoltaic semiconductor device in accordance with claim 2 wherein said second semiconductor layers have a multiple layer structure including a crystalline silicon layer and amorphous silicon layers.

6. A photovoltaic semiconductor device in accordance with claim 1 wherein a part of said second semiconductor layers is crystalline silicon.

7. A method for manufacturing a photovoltaic semiconductor device including a plurality of unit photovoltaic elements disposed on a substrate and connected in series comprising:
   a first step of selectively forming a plurality of first semiconductor layers on a high-temperature-resistant insulating substrate spaced apart from each other at a predetermined interval;
   a second step of forming first insulating layers between pairs of adjacent first semiconductor layers on said insulating substrate and overlying part of at lest one of said adjacent first semiconductor layers;
   a third step of selectively forming a plurality of second semiconductor layers on respective first semiconductor layers;
   a fourth step of forming photovoltaic junctions in said second semiconductor layers;
   a fifth step of forming an opening in said first insulating layer on each of said first semiconductor layers; and
   a sixth step of forming respective electrodes on said semiconductor layers, each electrode contacting the first semiconductor layer adjacent the respective second semiconductor layer on which the electrode is disposed through the respective opening in said first insulating layer.

8. A method for manufacturing a photovoltaic semiconductor device in accordance with claim 7 wherein said fifth step comprises forming second insulating layers on respective side walls of said second semiconductor layers after the openings are formed in the first insulating layer.

9. A method for manufacturing a photovoltaic semiconductor device in accordance with claim 8 wherein said first step comprises recrystallizing said first semiconductor layers after the first semiconductor layers are formed.

10. A method for manufacturing a photovoltaic semiconductor device in accordance with claim 7 wherein said fifth step comprises forming an additional semiconductor layer on and as part of the second semiconductor layers after the openings are formed in the insulating layer so that the second semiconductor layer has a multiple layer structure, and
    said sixth step comprises forming electrodes on said multiple layer structure second semiconductor layers after said fifth step or after said additional semiconductor layer is patterned.

11. A method for manufacturing a photovoltaic semiconductor device in accordance with claim 10 wherein said first step comprises recrystallizing said first semiconductor layers after the first semiconductor layers are formed.

12. A method for manufacturing a photovoltaic semiconductor device in accordance with claim 7 wherein said first step comprises recrystallizing said first semiconductor layers after the first semiconductor layers are formed.

* * * * *

UNITED STATES PATENT AND TRADEMARK OFFICE
CERTIFICATE OF CORRECTION

PATENT NO. : 5,147,468
DATED : September 15, 1992
INVENTOR(S) : Mikio Deguchi

It is certified that error appears in the above-identified patent and that said Letters Patent is hereby corrected as shown below:

Claim 7, column 12, line 23, change "lest" to --least--.

Signed and Sealed this

Twelfth Day of October, 1993

Attest:

BRUCE LEHMAN

*Attesting Officer*   *Commissioner of Patents and Trademarks*